(12) United States Patent
Xiao et al.

(10) Patent No.: US 9,899,528 B2
(45) Date of Patent: Feb. 20, 2018

(54) MANUFACTURING METHOD FOR TFT ARRAY SUBSTRATE, TFT ARRAY SUBSTRATE AND DISPLAY DEVICE

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Juncheng Xiao, Guangdong (CN); Mang Zhao, Guangdong (CN)

(73) Assignees: Shenzhen China Star Optoelectronics Technology Co., Ltd., Shenzhen, Guangdong (CN); Wuhan China Star Optoelectronics Technology Co., Ltd., Wuhan, Hubei (CN)

(*) Notice: Subject to any disclaimer, the term of this patent is extended or adjusted under 35 U.S.C. 154(b) by 274 days.

(21) Appl. No.: 14/890,698

(22) PCT Filed: Oct. 21, 2015

(86) PCT No.: PCT/CN2015/092351
§ 371 (c)(1),
(2) Date: Nov. 12, 2015

(87) PCT Pub. No.: WO2017/054258
PCT Pub. Date: Apr. 6, 2017

(65) Prior Publication Data
US 2017/0186878 A1   Jun. 29, 2017

(30) Foreign Application Priority Data
Sep. 30, 2015 (CN) .......................... 201510638669.8

(51) Int. Cl.
*H01L 29/10* (2006.01)
*H01L 29/786* (2006.01)
(Continued)

(52) U.S. Cl.
CPC .......... *H01L 29/78621* (2013.01); *G03F 1/22* (2013.01); *H01L 25/0655* (2013.01); *H01L 29/41733* (2013.01); *H01L 29/78696* (2013.01)

(58) Field of Classification Search
CPC ............. G09G 3/3677; G09G 2310/08; G09G 2310/0286; G09G 2300/0408;
(Continued)

(56) References Cited

U.S. PATENT DOCUMENTS

2003/0194839 A1   10/2003   Chung
2006/0199337 A1    9/2006   Chang et al.
(Continued)

FOREIGN PATENT DOCUMENTS

| CN | 101236976 A | 8/2008 |
| CN | 104867983 A | 8/2015 |
| JP | 2004303791 A | 10/2004 |

*Primary Examiner* — Robert Bachner
(74) *Attorney, Agent, or Firm* — Andrew C. Cheng

(57) ABSTRACT

The disclosure provides a manufacturing method for TFT array substrate, a TFT array substrate and a display device. The manufacturing method includes following steps: in sequence, forming a gate pattern layer, a gate insulating layer, a patterned poly-silicon layer, a separation layer on s substrate, and adopting a mask to form a source pattern layer and a drain pattern layer on the separation layer by photolithography processes. The source pattern layer and the drain pattern layer are connected to the patterned poly-silicon layer. The mask blocks one side of the channel area, and the same mask is adopted to form a lightly doped area on the other side of the channel area not blocked by the mask. The disclosure may reduce production costs and has great design flexibility.

12 Claims, 7 Drawing Sheets

(51) Int. Cl.
*H01L 29/417* (2006.01)
*H01L 25/065* (2006.01)
*G03F 1/22* (2012.01)

(58) Field of Classification Search
CPC ......... G09G 3/3648; G09G 2310/0267; G09G 2330/021; G09G 3/3696; G09G 2310/06; G09G 2310/0251; G09G 3/3674; G09G 2310/0202; G09G 2310/00
See application file for complete search history.

(56) References Cited

U.S. PATENT DOCUMENTS

| | | |
|---|---|---|
| 2007/0170526 A1 | 7/2007 | Satou |
| 2013/0286300 A1 | 10/2013 | Lee |
| 2016/0293770 A1 | 10/2016 | Peng |
| 2016/0343828 A1 | 11/2016 | Hsu |
| 2017/0141138 A1 | 5/2017 | Wang et al. |

FIG 1 (Piror Art)

FIG 2 (Piror Art)

US 9,899,528 B2

MANUFACTURING METHOD FOR TFT ARRAY SUBSTRATE, TFT ARRAY SUBSTRATE AND DISPLAY DEVICE

TECHNICAL FIELD

The disclosure relates to the field of liquid crystal technology, and more particularly, to a manufacturing method for TFT array substrate, a TFT array substrate and a display device.

BACKGROUND

As the technology of low temperature poly-silicon (LTPS) in thin-film transistor (TFT) advances and the characteristic of ultra-high carrier mobility of the LTPS semiconductor, the corresponding peripheral integrated circuit of the panel has drawn much attention. Additionally, many people put effort in the research in relation to system on panel (SOP) and make it available. However, because of the ultra-high carrier mobility of the LTPS, it is much worse than A-Si in terms of electric leakage. Hence, it is crucial to solve the problem of electric leakage in the LTPS design.

As shown in FIGS. 1 and 2, FIG. 1 is a flow chart of a manufacturing method of a TFT array substrate of current technology and FIG. 2 is a process flow diagram of the manufacturing method of the TFT array substrate based on the current technology. In the current technology, the manufacturing method of LTPS-TFT having the bottom gate structure comprises the following steps:

S10, forming a gate pattern layer 41 on a substrate 40;

S11, forming a gate insulating layer 42 on the gate pattern layer 41;

S12, forming a patterned poly-silicon layer 43 on the gate insulating layer 42, the patterned poly-silicon layer 43 being connected to the gate insulating layer 42;

S13, forming a heavily doped source area 431 and a heavily doped drain area 432 on two sides of the patterned poly-silicon layer 43 respectively;

S14, adopting a mask to form a lightly doped source area 434 on the inner side of the heavily doped source area 431, and to form a lightly doped drain area 433 on the inner side of the heavily doped drain area 432, a channel area being between the lightly doped source area 434 and the lightly doped drain area 433;

S15, forming a separation layer 44 on the patterned poly-silicon layer 43; and

S16, forming source and drain pattern layers 45 on the separation layer 44 and making the source and drain pattern layers 45 be connected with the patterned poly-silicon layer 43.

In the manufacturing method, in step S14 where the lightly doped area is formed, it is required to specially design a mask to block the area outside the region for the lightly doped area. This therefore increases the cost of the method.

SUMMARY

The disclosure provides a manufacturing method for TFT array substrate, a TFT array substrate and a display device, which are capable of solving the problem of increased cost on specifically designing a mask for the lightly doped area.

In order to solve the aforementioned technical problem, one embodiment of the disclosure is to provide a manufacturing method for TFT array substrate comprising steps of: forming a gate pattern layer on a substrate; forming a gate insulating layer on the gate pattern layer; forming a patterned poly-silicon layer on the gate insulating layer, the patterned poly-silicon layer being connected to the gate pattern layer; forming a heavily doped source area and a heavily doped drain area on two sides of the patterned poly-silicon layer respectively, the middle section of the poly-silicon layer being a channel area; forming a separation layer on the patterned poly-silicon layer; and adopting a mask to form a source pattern layer and a drain pattern layer on the separation layer by photolithography processes, the source pattern layer and the drain pattern layer being connected to the patterned poly-silicon layer, the mask blocking one side of the channel area, adopting the same mask to form a lightly doped area on the other side of the channel area not blocked by the mask.

Wherein, adopting a mask to form a source pattern layer and a drain pattern layer on the separation layer by photolithography processes comprises: depositing metal on the separation layer to form a metal layer; coating photoresist on the metal layer; adopting ultraviolet going through a mask to perform exposure on the photoresist; performing development on the photoresist to make the photoresist form a pattern, the pattern formed by the photoresist blocking a part of the metal layer while the other part of the metal layer being exposed; performing etching on the part of the metal layer which is exposed, for forming the source pattern layer and the drain pattern layer; adopting the same mask to perform ion implantation on the other side of the channel area which is not blocked for forming the lightly doped area; and stripping off the photoresist.

Wherein, after forming a gate insulating layer on the gate pattern layer, the step further comprises: forming a gate through hole on the gate insulating layer and filling a conductive material in the gate through hole; in the step of forming a patterned poly-silicon layer on the gate insulating layer and the patterned poly-silicon layer being connected to the gate pattern layer, the patterned poly-silicon layer being connected to the gate pattern layer via the conductive material in the gate through hole.

Wherein, after forming a separation layer on the patterned poly-silicon layer, the step further comprises: forming a source through hole on a place of the separation layer corresponding to the heavily doped source area while forming a drain through hole on a place of the separation layer corresponding to the heavily doped drain area; in the step of depositing metal on the separation layer to form a metal layer, the metal being filled in the source through hole and the drain through hole for making the source pattern layer and the drain pattern layer be connected with the poly-silicon layer.

Wherein, the step of forming a patterned poly-silicon layer on the gate insulating layer comprises: depositing an amorphous silicon layer on the gate insulating layer; transforming the amorphous silicon layer into the poly-silicon layer; etching the poly-silicon layer to form the patterned poly-silicon layer.

Wherein, the step of transforming the amorphous silicon layer into the poly-silicon layer adopts excimer laser annealing or solid phase crystallization to transform the amorphous silicon layer into the poly-silicon layer.

To solve the aforementioned technical problem, another embodiment of the disclosure is to provide a TFT array substrate comprising: a substrate, a gate pattern, a gate insulating layer, a patterned poly-silicon layer, a separation layer, a source pattern layer and a drain pattern layer. Wherein, the gate pattern layer is formed on the substrate; the gate insulating layer formed on the gate pattern layer; the patterned poly-silicon layer is formed on the gate insulating layer, the patterned poly-silicon layer is connected to the gate pattern layer, two sides of the patterned poly-silicon layer are a heavily doped source area and a heavily doped drain area respectively, and the middle section of the poly-silicon layer is a channel area; the separation layer is formed on the patterned poly-silicon layer; and the source pattern layer and a drain pattern layer are formed on the separation layer by photolithography processes, the source pattern layer and the drain pattern layer are connected to the patterned poly-silicon layer, patterns of the source pattern layer and the drain pattern layer blocking one side of the channel area, the other side of the channel area not blocked by the patterns of the source pattern layer and the drain pattern layer is a lightly doped area.

Wherein, a gate through hole is formed on the gate insulating layer and a conductive material is filled in the gate through hole, the patterned poly-silicon layer is connected to the gate pattern layer via the conductive material in the gate through hole.

Wherein, a source through hole is formed on a place of the separation layer corresponding to the heavily doped source area while a drain through hole is formed on a place of the separation layer corresponding to the heavily doped drain area, the source pattern layer and the drain pattern layer are made of metal, the metal is filled in the source through hole and the drain through hole for making the source pattern layer and the drain pattern layer be connected with the patterned poly-silicon layer.

To solve the aforementioned technical problem, another embodiment of the disclosure is to provide a display device comprising a TFT array substrate, wherein the TFT array substrate comprises a substrate, a gate pattern, a gate insulating layer, a patterned poly-silicon layer, a separation layer, a source pattern layer and a drain pattern layer. Wherein, the gate pattern layer is formed on the substrate; the gate insulating layer formed on the gate pattern layer; the patterned poly-silicon layer is formed on the gate insulating layer, the patterned poly-silicon layer is connected to the gate pattern layer, two sides of the patterned poly-silicon layer are a heavily doped source area and a heavily doped drain area respectively, and the middle section of the poly-silicon layer is a channel area; the separation layer is formed on the patterned poly-silicon layer; and the source pattern layer and a drain pattern layer are formed on the separation layer by photolithography processes, the source pattern layer and the drain pattern layer are connected to the patterned poly-silicon layer, patterns of the source pattern layer and the drain pattern layer blocking one side of the channel area, the other side of the channel area not blocked by the patterns of the source pattern layer and the drain pattern layer is a lightly doped area.

Wherein, a gate through hole is formed on the gate insulating layer and a conductive material is filled in the gate through hole, the patterned poly-silicon layer is connected to the gate pattern layer via the conductive material in the gate through hole.

Wherein, a source through hole is formed on a place of the separation layer corresponding to the heavily doped source area while a drain through hole is formed on a place of the separation layer corresponding to the heavily doped drain area, the source pattern layer and the drain pattern layer are made of metal, the metal is filled in the source through hole and the drain through hole for making the source pattern layer and the drain pattern layer be connected with the patterned poly-silicon layer.

The advantages of the disclosure includes: different from current technologies, the manufacturing method of the TFT array substrate of the disclosure uses the shape of the mask to block one side of the channel area when forming the source and drain pattern layers. This enables the process to use the same mask to form the lightly doped area formed on the other side of the channel area, without designing a new mask for forming the lightly doped area. This omits the extra design of the mask and reduces the costs thereof. Furthermore, this manufacturing method has great design flexibility because it can control the size of the lightly doped area by adjusting the size of the channel area blocked by the mask, which is able to flexibly adjust the effect of leakage current affected by the lightly doped area.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

The specific embodiments along with the Figures of the disclosure are illustrated hereinafter.

Figure 1:
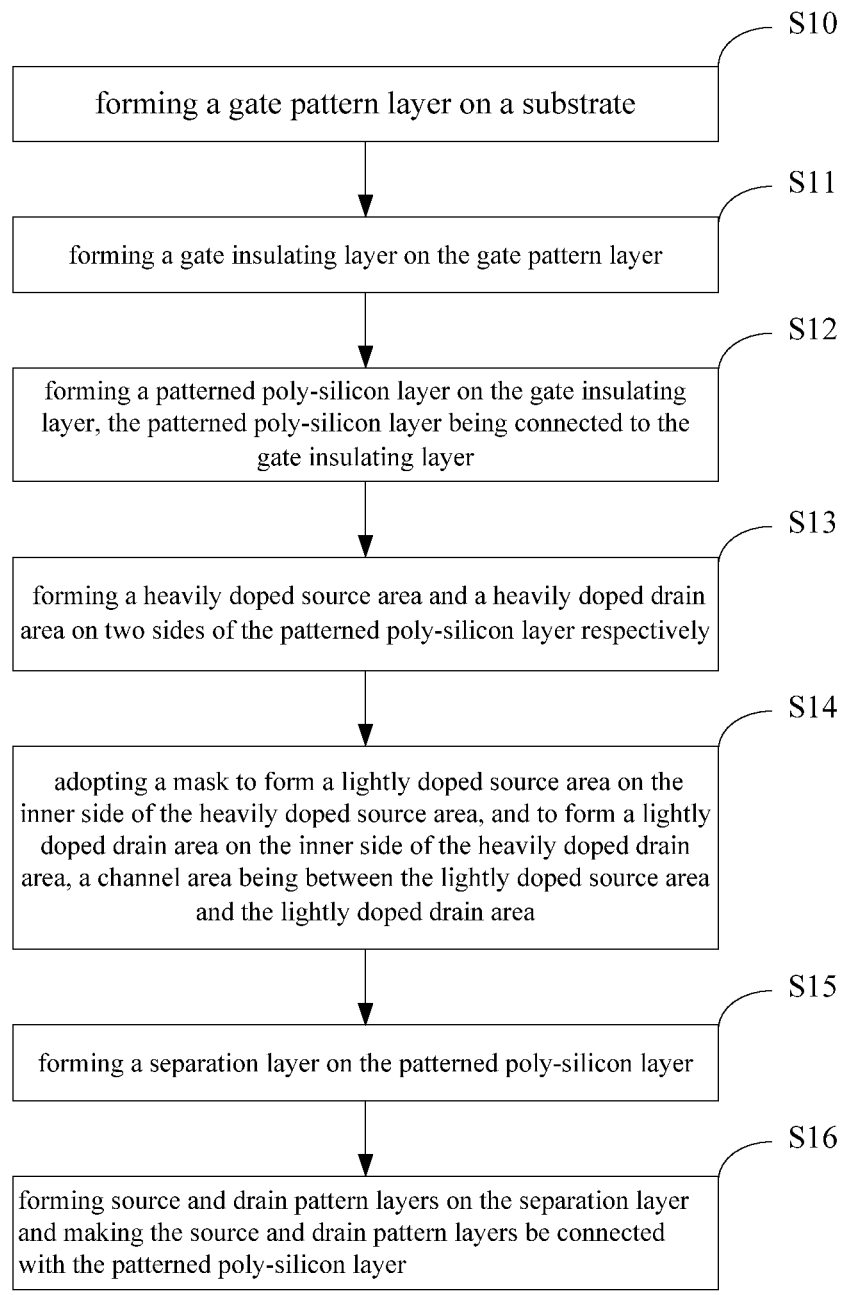
FIG. 1 is a flow chart of a manufacturing method of a TFT array substrate of current technology.
Figure 2:
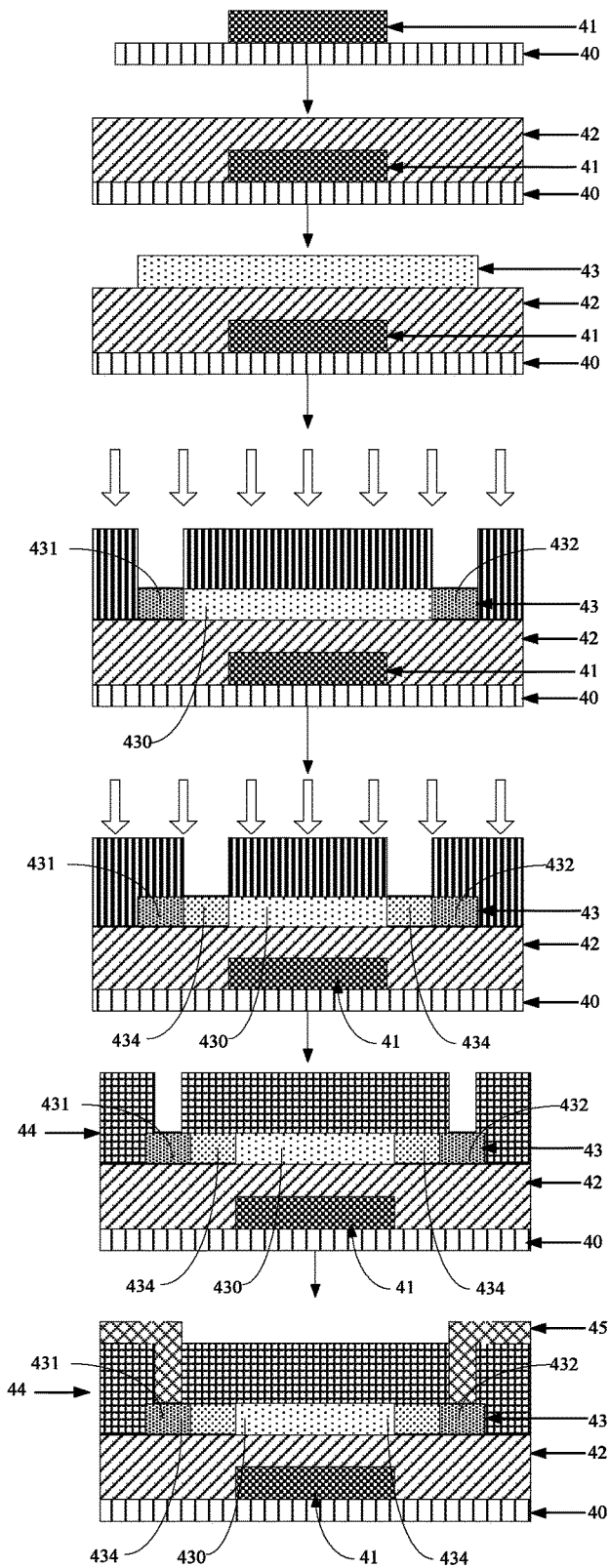
FIG. 2 is a process flow diagram of the manufacturing method of the TFT array substrate of current technology.
Figure 3:
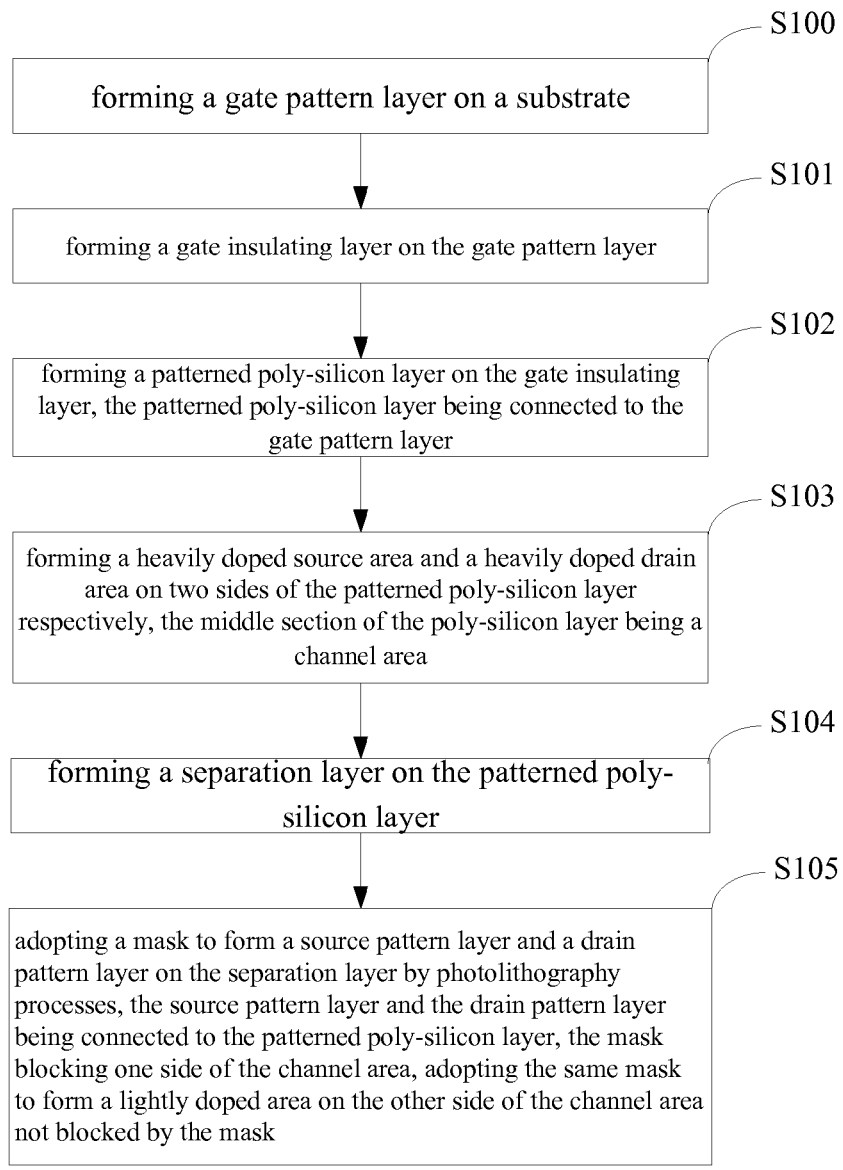
FIG. 3 is a flow chart of a manufacturing method of a TFT array substrate according to the first embodiment of the disclosure.
Figure 4:
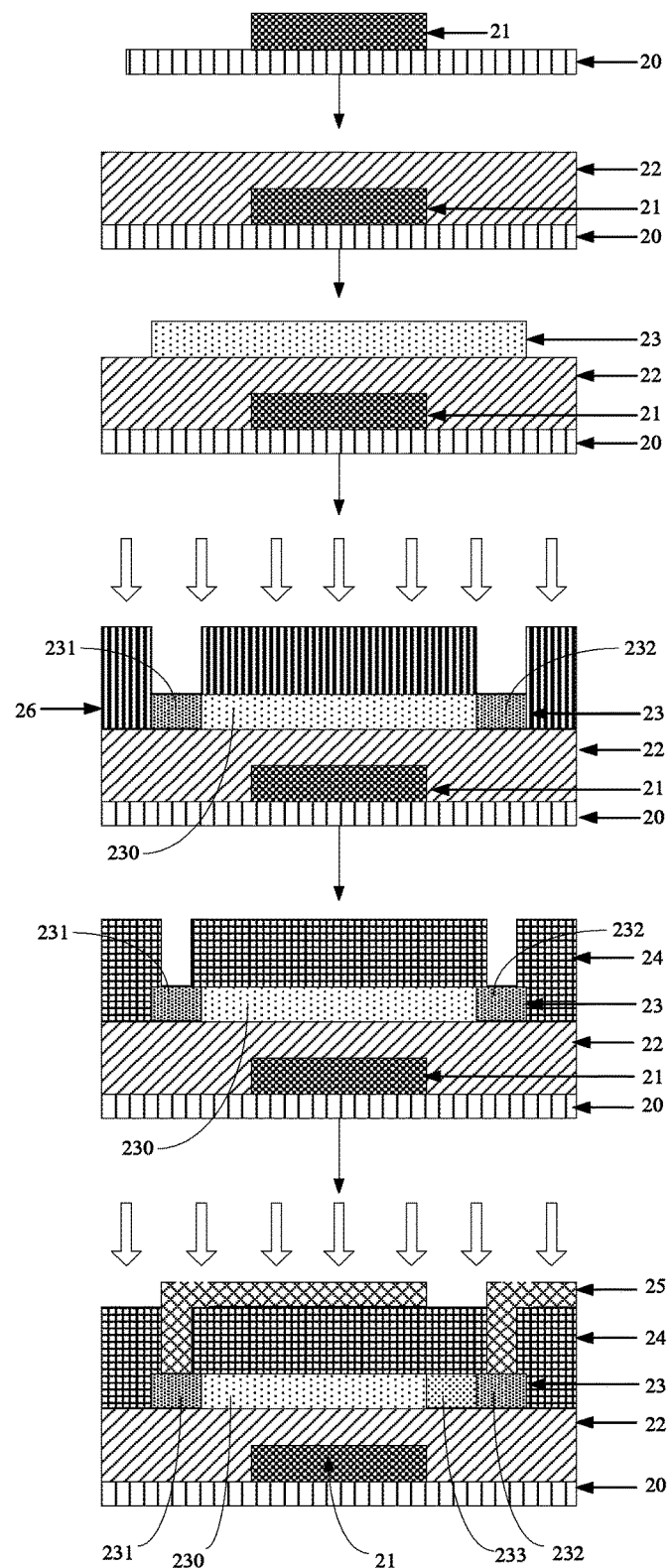
FIG. 4 is a process flow diagram of a manufacturing method of a TFT array substrate according to the first embodiment of the disclosure.

Referring to FIG. 3 and FIG. 4, FIG. 3 is a flow chart of a manufacturing method of a TFT array substrate according to the first embodiment of the disclosure; FIG. 4 is a process flow diagram of a manufacturing method of a TFT array substrate according to the first embodiment of the disclosure.

The manufacturing method of the TFT array substrate of the disclosure comprises the following steps:

S100, forming a gate pattern layer 21 on a substrate 20.

For example, the gate pattern layer 21 is formed as follows: deposit metal on the substrate to form a gate metal layer. The metal of the gate is aluminum and aluminum alloy, or metal compound conductive layer formed by stacking up an aluminum layer, a tungsten layer, a chromium layer together. Subsequently, the gate metal layer is coated with photoresist. Then, adopt the mask to perform lithography on the photoresist so that the photoresist form the pattern required. The pattern formed by the photoresist blocks a part of the gate metal layer while the other part of the gate metal layer is exposed. Perform etching on the exposed part of the gate metal layer, so as to form the gate pattern required. Lastly, strip off the photoresist to form the gate pattern layer 21.

S101, forming a gate insulating layer 22 on the gate pattern layer 21.

In step S101, the gate insulating layer 22 is formed through CVD or PECVD technology. The gate insulating layer 22 is a single layer structure, such as a SiO2 layer. Surely, the gate insulating layer 22 may also be a double layer structure, such as a SiO2 layer and A SiNx layer stacked up together.

S102, forming a patterned poly-silicon layer 23 on the gate insulating layer 22, the patterned poly-silicon layer 23 being connected to the gate pattern layer 22.

Figure 5:
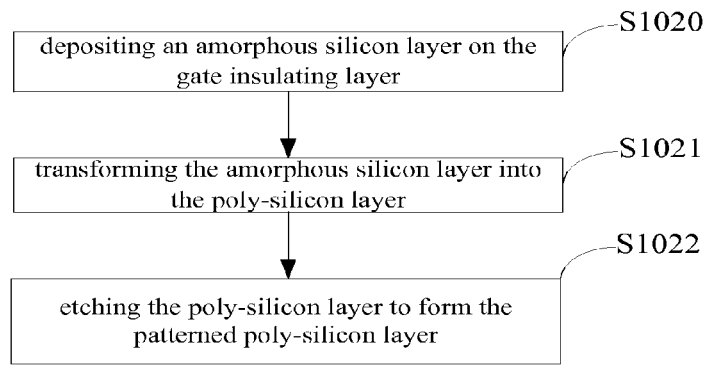
FIG. 5 is a flow chart of the step S102 of FIG. 3.

Specifically, FIG. 5 is a flow chart of the step S102 of FIG. 3. As shown in FIG. 5, the deformation of the patterned poly-silicon layer 23 comprises the following steps:

S1020, depositing an amorphous silicon layer on the gate insulating layer 22;

S1021, transforming the amorphous silicon layer into the poly-silicon layer; and S1022, etching the poly-silicon layer to form the patterned poly-silicon layer 23.

The step 1022 specifically comprises the following steps:

The poly-silicon layer is coated with photoresist 26. Then, adopt the mask to perform lithography on the photoresist 26 so that the photoresist form the pattern required. The pattern formed by the photoresist 26 blocks a part of the poly-silicon layer while the other part of the poly-silicon layer is exposed. Perform etching on the exposed part of the poly-silicon layer, so as to form the pattern of the poly-silicon layer required. Lastly, strip off the photoresist 26 to form the patterned poly-silicon layer 23.

S103, forming a heavily doped source area 231 and a heavily doped drain area 232 on two sides of the patterned poly-silicon layer 23 respectively, the middle section of the poly-silicon layer 23 being a channel area 230.

In step S103, the patterned poly-silicon layer 23 is firstly coated with the photoresist. Then, via techniques such as the exposure and development, the position of the patterned poly-silicon layer 23 which needs to form the heavily doped source area 231 and the heavily doped drain area 232 is exposed. Subsequently, ion is implanted in the position through ion implantation method to form the heavily doped source area 231 and the heavily doped drain area 232.

S104, forming a separation layer 24 on the patterned poly-silicon layer 23.

In the step S104, the separation layer 24 is a SiO2 layer formed by CVD or PECVD technique. The separation layer 24 is above and covers the patterned poly-silicon layer 23, for blocking the patterned poly-silicon layer 23 as well as the source and drain pattern layers 25.

S105, adopting a mask to form a source pattern layer 25 and a drain pattern layer 25 on the separation layer 24 by photolithography processes, the source pattern layer 25 and the drain pattern layer 25 being connected to the patterned poly-silicon layer 23, the mask blocking one side of the channel area 230, adopting the same mask to form a lightly doped area 233 on the other side of the channel area 230 not blocked by the mask.

Figure 6:
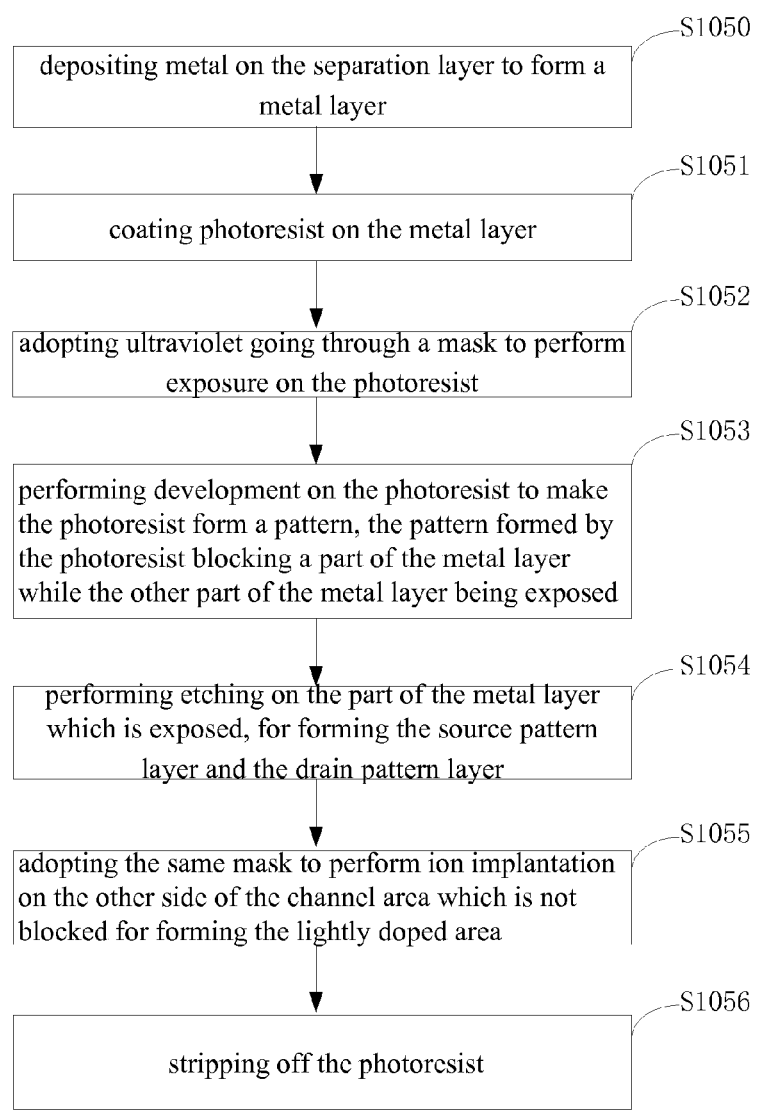
FIG. 6 is a flow chart of the step S105 of FIG. 3.

In the step S105, the specific forming process of the source and drain pattern layers 25 can be seen in FIG. 6 and the process includes the following steps:

S1050, depositing metal on the separation layer 24 to form a metal layer.

The step S1050 is done by the sputtering process, for instance, sputtering metal such as aluminum or chromium to form the metal layer.

S1051, coating photoresist on the metal layer.

In this embodiment, the step S1051 adopts the spin-coating process, in which the thickness of the photoresist is 15000±500 Å.

S1052, adopting ultraviolet going through a mask to perform exposure on the photoresist.

This embodiment utilizes a positive photoresist. Ultraviolet light goes through the mask to irradiate the photoresist, wherein the mask blocks a part of the photoresist while the other part is exposed. The photoresist exposed is softened by the irradiation of ultraviolet while the part of the photoresist blocked by the mask does not change.

S1053, performing development on the photoresist to make the photoresist form a pattern, the pattern formed by the photoresist blocking a part of the metal layer while the other part of the metal layer being exposed.

In the step S1053, the developer is used to remove the softened photoresist.

S1054, performing etching on the part of the metal layer which is exposed, for forming the source pattern layer and the drain pattern layer.

The etching process is for removing unneeded metal to form the pattern on the metal layer. The etching technique includes wet etching and dry etching. Wet etching uses corrosive fluid to remove unneeded metal. Dry etching, on the other hand, uses gas discharge under reduced pressure to make it reacts for becoming gaseous.

S1055, adopting the same mask to perform ion implantation on the other side of the channel area 230 which is not blocked for forming the lightly doped area 233.

The Lightly DopedDrain (LDD) 233 structure is for weakening the electric field, so as to improve the problem of hot electron degradation effect. That is, a Lightly DopedDrain is disposed on the channel to sustain partial voltage. This kind of structure is capable of avoiding the hot electron degradation effect. As the gate width decreases, the channel length under gate structure decreases. The decrease of the channel length of the transistor reduces the possibility of electrical breakdown and generating undesirable channel current.

In the step S1055, the mask of the step S1052 is still used to keep its position fixed. The mask blocks one side of the channel. In this embodiment, the mask blocks one side of the channel area 230 near the heavily doped source area 231 while the side of the channel area 230 near the heavily doped drain area 232 is exposed. Through ion implantation, the exposed side of the channel area 230 forms the lightly doped area 233. This steps utilizes the mask of the step S1052 so the design of the mask for this step is not required, which therefore reduces the costs.

S1056, stripping off the photoresist.

After stripping off the photoresist, source and drain metal layers 25 can be exposed. The stripping process includes wet stripping and dry stripping. Wet stripping utilizes stripping liquid to remove photoresist forming the pattern. Dry stripping makes the photoresist oxidized through oxide discharge in a decompression condition, and therefore removes it in a gas state. Alternatively, it may also use ozone or UV irradiation to make photoresist oxidized and it volatilizes.

A TFT made by the method of the disclosure is the TFT having a one-sided lightly doped area 233. When it is required for the lightly doped area 233 to reduce drain current like double-sided lightly doped area, the mask may be designed to block smaller area of the channel area and this increases the size of the lightly doped area 233. The larger lightly doped area 233 is capable of producing the same effect of reducing the drain current as the double-sided lightly doped area.

In this embodiment, TFT on the TFT array substrate is N-type TFT. The heavily doped source area 231 and the heavily doped drain area 232 of the poly-silicon layer 23 are doped with pentavalent elements (such as phosphorus). The channel area 230 is not doped with any impurity element. Phosphorus replaces silicon atoms in the lattice and the N-type semiconductor is thus formed. In the N-type semiconductor, free electrons are the majority carrier while holes are the minority carrier. The electrical conduction is mainly through the free electrons. The free electrons are mainly provided by impurity atoms while holes are formed by the thermal excitation. The concentration of the majority carrier (free electrons) increases as the impurities rises, which results in stronger conductivity.

The manufacturing method of the disclosure may also be used for the P-type TFT. Generally, the heavily doped source area and the heavily doped drain area of the P-type TFT are doped with trivalent elements (such as boron). Boron replaces silicon atoms in the lattice and the P-type semiconductor is thus formed. In the P-type semiconductor, holes are the majority carrier while free electrons are the minority carrier. The electrical conduction is mainly through the holes. The holes are mainly provided by impurity atoms while free electrons are formed by the thermal excitation. The concentration of the majority carrier (holes) increases as the impurities rises, which results in stronger conductivity.

Different from current technologies, the manufacturing method of the TFT array substrate of the disclosure uses the shape of the mask to block one side of the channel area when forming the source and drain pattern layers. This enables the process to use the same mask to form the lightly doped area formed on the other side of the channel area, without designing a new mask for forming the lightly doped area. This omits the extra design of the mask and reduces the costs thereof. Furthermore, this manufacturing method has great design flexibility because it can control the size of the lightly doped area by adjusting the size of the channel area blocked by the mask, which is able to flexibly adjust the effect of leakage current affected by the lightly doped area.

Figure 7:
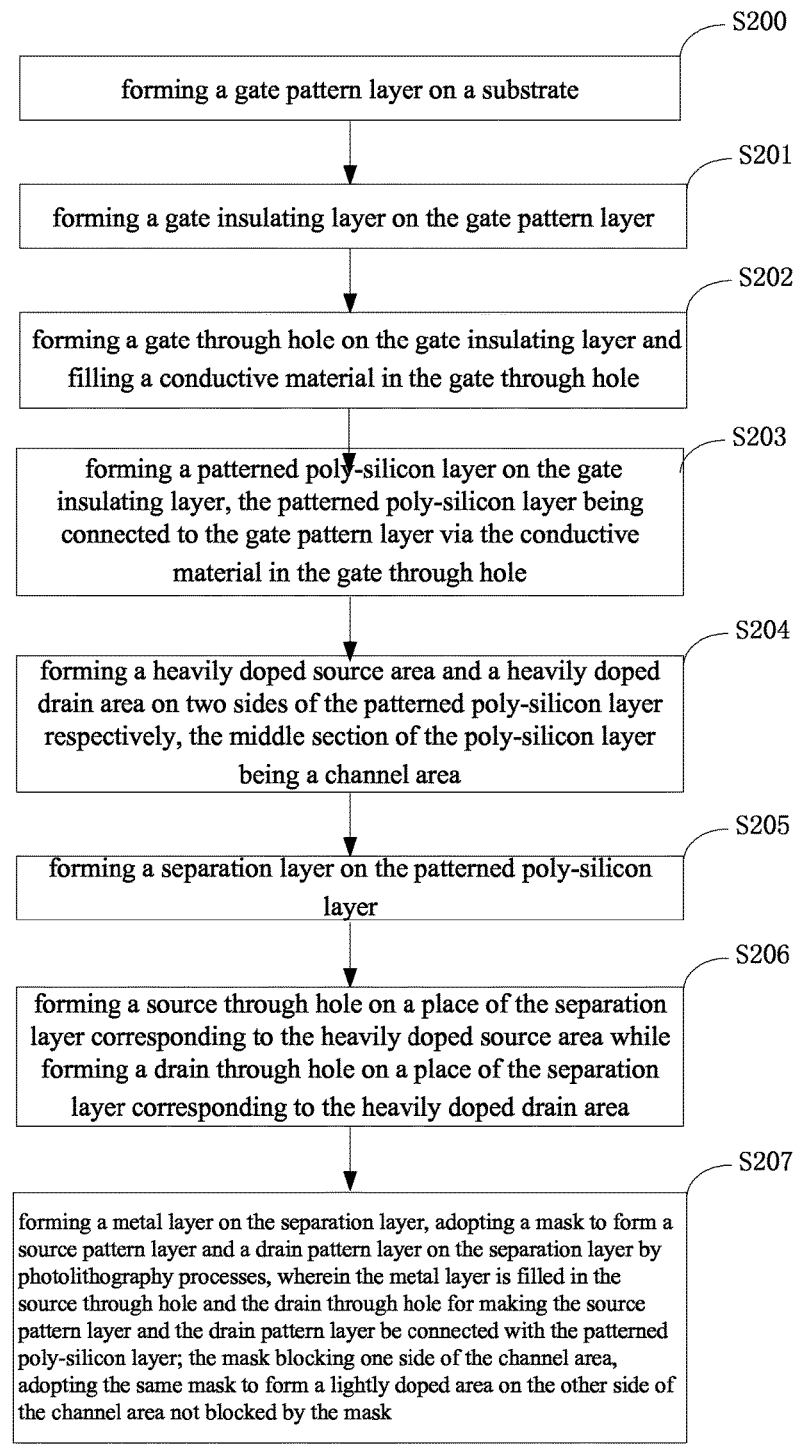
FIG. 7 is a flow chart of a manufacturing method of a TFT array substrate according to the second embodiment of the disclosure.

Referring to FIG. 7, FIG. 7 is a flow chart of a manufacturing method of a TFT array substrate according to the second embodiment of the disclosure.

In this embodiment, the manufacturing method of TFT includes the following steps:

S200, forming a gate pattern layer on a substrate;

S201, forming a gate insulating layer on the gate pattern layer;

S202, forming a gate through hole on the gate insulating layer and filling a conductive material in the gate through hole;

S203, forming a patterned poly-silicon layer on the gate insulating layer, the patterned poly-silicon layer being connected to the gate pattern layer via the conductive material in the gate through hole;

S204, forming a heavily doped source area and a heavily doped drain area on two sides of the patterned poly-silicon layer respectively, the middle section of the poly-silicon layer being a channel area;

S205, forming a separation layer on the patterned poly-silicon layer;

S206, forming a source through hole on a place of the separation layer corresponding to the heavily doped source area while forming a drain through hole on a place of the separation layer corresponding to the heavily doped drain area;

S207, forming a metal layer on the separation layer, adopting a mask to form a source pattern layer and a drain pattern layer on the separation layer by photolithography processes, wherein the metal layer is filled in the source through hole and the drain through hole for making the source pattern layer and the drain pattern layer be connected with the patterned poly-silicon layer; the mask blocking one side of the channel area, adopting the same mask to form a lightly doped area on the other side of the channel area not blocked by the mask.

Figure 8:
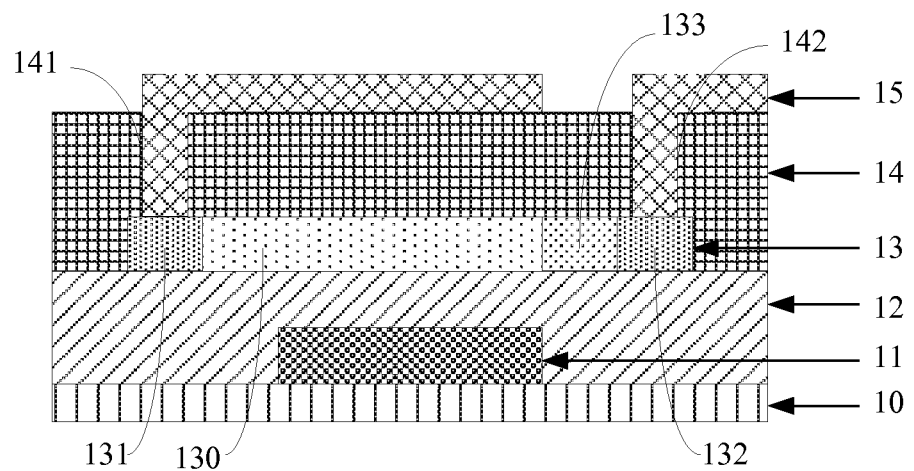
FIG. 8 is a sectional view of the TFT array substrate according to one embodiment of the disclosure.

Referring to FIG. 8, FIG. 8 is a sectional view of the TFT array substrate according to one embodiment of the disclosure.

The disclosure provides a TFT array substrate comprising a substrate 10, a gate pattern layer 11, a gate insulating layer 12, a patterned poly-silicon layer 13, a separation layer 14 and source and drain pattern layers 15.

Specifically, the substrate 10 may be a glass substrate. The material of the glass substrate is uniform and has high transparency, low reflectivity and good thermal stability. Properties thereof can remain stable after multiple high-temperature processes. Since the TFT manufacturing process used a large amount of chemicals, the glass substrate is required to have good chemical resistance. The glass substrate is also required to have sufficient mechanical strength, excellent precision machining quality and good electrical insulating properties.

A gate pattern layer 11 is formed on the substrate 10. The gate pattern layer 11 is aluminum and aluminum alloy, or metal compound conductive layer formed by stacking up an aluminum layer, a tungsten layer, a chromium layer together. The gate metal layer is firstly formed and then is etched to be the gate pattern layer 11.

The gate insulating layer 12 is above and covers the gate pattern layer. The gate insulating layer 12 may be a single layer or a double layer. The first layer may be SiO, SiN or AlO of which the thickness is around 175-300 nm. In this embodiment, the gate insulating layer 12 comprise a layer of SiO2.

In this embodiment, the gate insulating layer 12 is disposed with a gate through hole (not shown in the Figure). The gate through hole is filled with the conductive material.

The patterned poly-silicon layer 13 is formed on the gate insulating layer 12. The patterned poly-silicon layer 13 is connected to the gate pattern layer 11. Specifically, the patterned poly-silicon layer 13 is connected to the gate pattern layer 11 via the conductive material in the gate through hole. Two sides of the patterned poly-silicon layer 13 are a heavily doped source area 131 and a heavily doped drain area 132 respectively. The middle section of the poly-silicon layer 13 is a channel area 130.

The separation layer 14 covers the patterned poly-silicon layer 13 for separating the patterned poly-silicon layer 13 from the source and drain pattern layers 15. The separation layer 14 of this embodiment is a SiO2 layer.

In this embodiment, a source through hole 141 is formed on a place of the separation layer 14 corresponding to the heavily doped source area 131 while a drain through hole 142 is formed on a place of the separation layer 14 corresponding to the heavily doped drain area 132.

The source and drain pattern layers 15 are formed on the separation layer 14. The source pattern layer 15 and the drain pattern layer 15 are connected to the patterned poly-silicon layer 13. Specifically, the source pattern layer 15 and the drain pattern layer 15 are made of metal. The metal is filled in the source through hole 141 and the drain through hole 142 for making the source and drain pattern layers 15 be connected with the patterned poly-silicon layer 13. Patterns of the source pattern layer 15 and the drain pattern layer 15 block one side of the channel area 130. The other side of the channel area 130 not blocked by the patterns of the source pattern layer 15 and the drain pattern layer 15 is a lightly doped area 133.

The source and drain pattern layers 15 are made of aluminum alloy, aluminum or chrome. The source is connected to the picture element electrode while the drain is connected to the data signal line.

Figure 9:
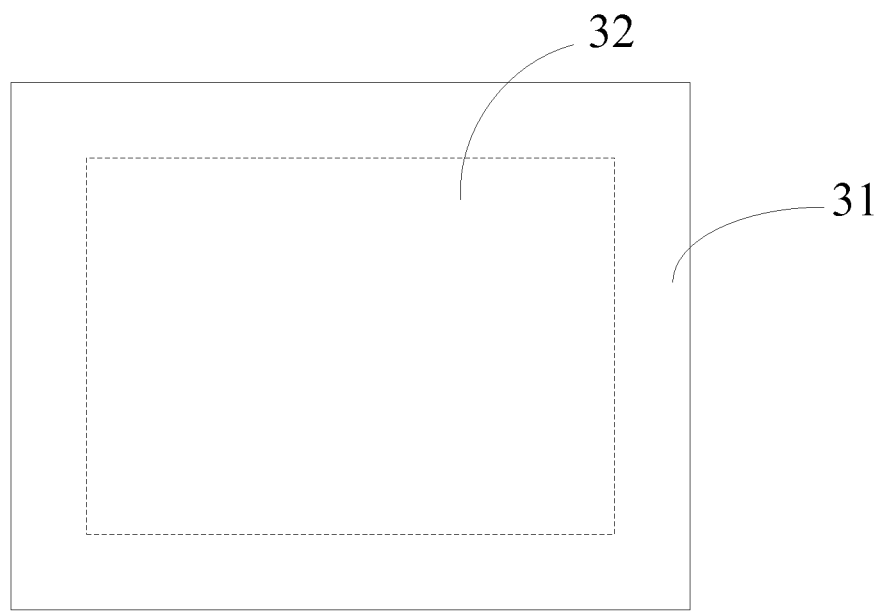
FIG. 9 is a schematic view of the structure of a display device of the closure.

Referring to FIG. 9, FIG. 9 is a schematic view of the structure of a display device of the closure.

The display device of the disclosure comprises a case 31 and the aforementioned TFT array substrate 32.

The disclosure omits the extra design of the mask and reduces the costs thereof. Furthermore, this manufacturing method has great design flexibility and is able to flexibly adjust the effect of leakage current affected by the lightly doped area.

While this disclosure has been described in terms of several embodiments, there are alterations, permutations, and equivalents, which fall within the scope of this disclosure. It should also be noted that there are many alternative ways of implementing the methods and apparatuses of the present disclosure. It is therefore intended that the following appended claims be interpreted as including all such alterations, permutations, and equivalents as fall within the true spirit and scope of the present disclosure.

What is claimed is:

1. A manufacturing method for TFT array substrate, comprising steps of:
    forming a gate pattern layer on a substrate;
    forming a gate insulating layer on the gate pattern layer;
    forming a patterned poly-silicon layer on the gate insulating layer, the patterned poly-silicon layer being connected to the gate pattern layer;
    forming a heavily doped source area and a heavily doped drain area on two sides of the patterned poly-silicon layer respectively, the middle section of the poly-silicon layer being a channel area;
    forming a separation layer on the patterned poly-silicon layer; and
    adopting a mask to form a source pattern layer and a drain pattern layer on the separation layer by photolithography processes, the source pattern layer and the drain pattern layer being connected to the patterned poly-silicon layer, the mask blocking one side of the channel area, adopting the same mask to form a lightly doped area on the other side of the channel area not blocked by the mask.

2. The method according to claim 1, wherein the step of adopting a mask to form a source pattern layer and a drain pattern layer on the separation layer by photolithography processes comprises:
    depositing metal on the separation layer to form a metal layer;
    coating photoresist on the metal layer;
    adopting ultraviolet going through a mask to perform exposure on the photoresist;
    performing development on the photoresist to make the photoresist form a pattern, the pattern formed by the photoresist blocking a part of the metal layer while the other part of the metal layer being exposed;
    performing etching on the part of the metal layer which is exposed, for forming the source pattern layer and the drain pattern layer;
    adopting the same mask to perform ion implantation on the other side of the channel area which is not blocked for forming the lightly doped area; and
    stripping off the photoresist.

3. The method according to claim 2, wherein after forming a gate insulating layer on the gate pattern layer, the step further comprises: forming a gate through hole on the gate insulating layer and filling a conductive material in the gate through hole;
    in the step of forming a patterned poly-silicon layer on the gate insulating layer and the patterned poly-silicon layer being connected to the gate pattern layer, the patterned poly-silicon layer being connected to the gate pattern layer via the conductive material in the gate through hole.

4. The method according to claim 3, wherein after forming a separation layer on the patterned poly-silicon layer, the step further comprises: forming a source through hole on a place of the separation layer corresponding to the heavily doped source area while forming a drain through hole on a place of the separation layer corresponding to the heavily doped drain area;
    in the step of depositing metal on the separation layer to form a metal layer, the metal being filled in the source through hole and the drain through hole for making the source pattern layer and the drain pattern layer be connected with the poly-silicon layer.

5. The method according to claim 4, wherein the step of forming a patterned poly-silicon layer on the gate insulating layer comprises:
    depositing an amorphous silicon layer on the gate insulating layer;
    transforming the amorphous silicon layer into the poly-silicon layer;
    etching the poly-silicon layer to form the patterned poly-silicon layer.

6. The method according to claim 5, wherein the step of transforming the amorphous silicon layer into the poly-silicon layer adopts excimer laser annealing or solid phase crystallization to transform the amorphous silicon layer into the poly-silicon layer.

7. A TFT array substrate, comprising:
    a substrate;
    a gate pattern layer formed on the substrate;
    a gate insulating layer formed on the gate pattern layer;
    a patterned poly-silicon layer formed on the gate insulating layer, the patterned poly-silicon layer being connected to the gate pattern layer, two sides of the patterned poly-silicon layer being a heavily doped source area and a heavily doped drain area respectively, the middle section of the poly-silicon layer being a channel area;
    a separation layer formed on the patterned poly-silicon layer; and
    a source pattern layer and a drain pattern layer formed on the separation layer by photolithography processes, the source pattern layer and the drain pattern layer being connected to the patterned poly-silicon layer, patterns of the source pattern layer and the drain pattern layer blocking one side of the channel area, the other side of the channel area not blocked by the patterns of the source pattern layer and the drain pattern layer being a lightly doped area.

8. The TFT array substrate according to claim 7, wherein a gate through hole is formed on the gate insulating layer and a conductive material is filled in the gate through hole, the patterned poly-silicon layer is connected to the gate pattern layer via the conductive material in the gate through hole.

9. The TFT array substrate according to claim 8, wherein a source through hole is formed on a place of the separation layer corresponding to the heavily doped source area while a drain through hole is formed on a place of the separation layer corresponding to the heavily doped drain area, the source pattern layer and the drain pattern layer are made of metal, the metal is filled in the source through hole and the drain through hole for making the source pattern layer and the drain pattern layer be connected with the patterned poly-silicon layer.

10. A display device comprising a TFT array substrate, wherein the TFT array substrate comprises:
   a substrate;
   a gate pattern layer formed on the substrate;
   a gate insulating layer formed on the gate pattern layer;
   a patterned poly-silicon layer formed on the gate insulating layer, the patterned poly-silicon layer being connected to the gate pattern layer, two sides of the patterned poly-silicon layer being a heavily doped source area and a heavily doped drain area respectively, the middle section of the poly-silicon layer being a channel area;
   a separation layer formed on the patterned poly-silicon layer; and
   a source pattern layer and a drain pattern layer formed on the separation layer by photolithography processes, the source pattern layer and the drain pattern layer being connected to the patterned poly-silicon layer, patterns of the source pattern layer and the drain pattern layer blocking one side of the channel area, the other side of the channel area not blocked by the patterns of the source pattern layer and the drain pattern layer being a lightly doped area.

11. The display device according to claim 10, wherein a gate through hole is formed on the gate insulating layer and a conductive material is filled in the gate through hole, the patterned poly-silicon layer is connected to the gate pattern layer via the conductive material in the gate through hole.

12. The display device according to claim 11, wherein a source through hole is formed on a place of the separation layer corresponding to the heavily doped source area while a drain through hole is formed on a place of the separation layer corresponding to the heavily doped drain area, the source pattern layer and the drain pattern layer are made of metal, the metal is filled in the source through hole and the drain through hole for making the source pattern layer and the drain pattern layer be connected with the patterned poly-silicon layer.

* * * * *